United States Patent
Ding et al.

(10) Patent No.: US 8,994,393 B2
(45) Date of Patent: Mar. 31, 2015

(54) HIGH-FREQUENCY COBRA PROBE

(75) Inventors: Hanyi Ding, Colchester, VT (US); John Ferrario, Waterbury, VT (US); Barton E. Green, Milton, VT (US); Richard J. St. Pierre, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 13/605,170

(22) Filed: Sep. 6, 2012

(65) Prior Publication Data

US 2014/0062519 A1 Mar. 6, 2014

(51) Int. Cl.
 *G01R 1/067* (2006.01)
 *G01R 1/073* (2006.01)

(52) U.S. Cl.
 CPC .................................. *G01R 1/07357* (2013.01)
 USPC ............. 324/755.06; 324/755.11; 324/755.01

(58) Field of Classification Search
 CPC .................................................. G01R 1/07357
 USPC ........................... 324/755.06, 755.11, 755.01
 See application file for complete search history.

(56) References Cited

U.S. PATENT DOCUMENTS

| | | | |
|---|---|---|---|
| 4,027,935 A | 6/1977 | Byrnes et al. | |
| 4,423,376 A | 12/1983 | Byrnes et al. | |
| 4,843,315 A | 6/1989 | Bayer et al. | |
| 5,977,787 A * | 11/1999 | Das et al. | 324/755.06 |
| 6,411,112 B1 | 6/2002 | Das et al. | |
| 6,472,892 B2 | 10/2002 | Pochmuller | |
| 6,529,021 B1 * | 3/2003 | Yu et al. | 324/754.2 |
| 6,798,223 B2 | 9/2004 | Huang et al. | |
| 7,088,118 B2 | 8/2006 | Liu et al. | |
| 7,282,378 B2 * | 10/2007 | Yoshida | 438/18 |
| 7,471,097 B2 | 12/2008 | Kang | |
| 7,554,348 B2 | 6/2009 | Brandorff | |
| 7,795,890 B2 | 9/2010 | Carlsen et al. | |
| 8,026,733 B2 | 9/2011 | Lee et al. | |
| 2006/0114008 A1 | 6/2006 | Fujii | |
| 2008/0143357 A1 | 6/2008 | Gaschke et al. | |
| 2008/0265920 A1 | 10/2008 | Ko | |
| 2009/0072849 A1 | 3/2009 | Dickson et al. | |
| 2011/0062978 A1 | 3/2011 | Kister | |

FOREIGN PATENT DOCUMENTS

JP 09015262 A 1/1997

OTHER PUBLICATIONS

Moore, Brian, "A new concept in RF Wafer Testing: 'Intelligent RF Probes", Scanimetrics, CMOS-ET Jul. 11, 2007, Whistler, 26 pages, http://www.cmoset.com/uploads/6.3.pdf.

(Continued)

*Primary Examiner* — Arleen M Vazquez
*Assistant Examiner* — Robert P Alejnikov, Jr.
(74) *Attorney, Agent, or Firm* — Michael Le Strange; Roberts Mlotkowski Safran & Cole, P.C.

(57) ABSTRACT

A test device including cobra probes and a method of manufacturing is disclosed. The test device includes a conductive upper plate having an upper guide hole and a conductive lower plate having a lower guide hole. The test device also includes a conductive cobra probe disposed between the upper guide hole of the upper plate and the lower guide hole of the lower plate. A dielectric material insulates the cobra probe from the upper plate and the lower plate.

13 Claims, 8 Drawing Sheets

(56) References Cited

OTHER PUBLICATIONS

Robertazzi, et al., "Ultimate Frequency Limitations of Cobra Probe Contactors", IBM Research, Jun. 1, 2003, 21 pages, http://www.swtestorg/swtw_library/2003proc/PDF/S03_03_Robertazzi.pdf.

Robertazzi, Raphael, "Area Array Cobra Probe Card with 5 GHz. Bandwidth", IBM Research, Jun. 12, 2002, 22 pages, http://www.swtest org/swtw_library/2002proc/PDF/S08_02.pdf.

Robertazzi, Raphael, "Area Array Probe Card Interposer", IBM Research, Jun. 4, 2001, 24 pages, http://www.swtest.org/swtw_library/2001proc/PDF/S2_02.pdf.

"Introduction to Probe Cards: How They are Built & Tested", Integrated Technology Corporation, 1998, 64 pages, http://www.swtest.org/swtw_library/1998proc/pdf/T2_itc1.pdf.

\* cited by examiner

HIGH-FREQUENCY COBRA PROBE

FIELD OF THE INVENTION

The present invention relates to electronic device on-wafer tests and, more specifically, to a test device including cobra probes, and methods of using the same.

BACKGROUND

On-wafer electronic devices, such as integrated circuits, or semiconductors, can be operationally tested by connecting a device under test ("DUT") to a test apparatus using cobra probes. Cobra probes are wires mounted in parallel with two plates which extend transversely to the long axes of the wires, their respective ends are terminated at a probe interface board (i.e., PIB) at top and the on-wafer DUT at bottom. The wires are pre-shaped in a curve so that they flex in a predetermined direction in response to an axial force. Electrical contacts at the ends of the cobra probes align with guide holes formed in the said two plates, an upper plate (i.e., upper die) and a lower plate (i.e., lower die). Upon depression of moving the wafer to the PIB, the electrical contacts are pressed against contact pads of both the PIB and the DUT to produce a temporary electrical connection with the test apparatus.

When connected to a DUT, the cobra probes become part of a circuit in which the cobra probes act as parasitic inductors. The amount of inductance corresponds to the cobra probes' physical dimensions (e.g., wire lengths). The effective inductance of the cobra probes can range from several nanohenries (nH) to tens of nH. In direct current (DC) and low frequency tests, the effects of the probes' inductance can be ignored. However, for DUTs that operate at high-frequencies (e.g., greater than several hundred megahertz), the inductance of the cobra probes may cause grounding and signal integrity issues. As such, the frequency range in which cobra probes can be used is normally limited to circumstances where their inductance is negligible. More specifically, the cobra probes' effective operational bandwidth can be quantified as frequency range in which insertion loss is less than 1 dB and return loss is greater than 10 dB. In other words, the through power loss due to a probe is less than 20% and the reflection power loss is less than 10%.

Accordingly, there exists a need in the art to overcome the deficiencies and limitations described hereinabove.

SUMMARY

In an aspect of the invention, a test device comprises a conductive upper plate having an upper guide hole and a conductive lower plate having a lower guide hole. The test device further comprises a conductive cobra probe disposed between the upper guide hole of the upper plate and the lower guide hole of the lower plate. The test device further comprises a dielectric material insulating the cobra probe from the upper plate and the lower plate.

In another aspect of the invention, a test device comprises an upper plate having an upper guide hole and a lower plate having a lower guide hole. The test device further comprises a conductive cobra probe disposed between the upper guide hole of the upper plate and the lower guide hole of the lower plate. The test device further comprises one or more dummy probes disposed between the upper plate and the lower plate flanking the cobra probe.

In another aspect of the invention, a method of forming a test device is provided. The method includes arranging a conductive cobra probe between an upper guide hole of an upper plate and a lower guide hole of a lower plate. Further, the method comprises insulating the cobra probe from the upper plate and the lower plate using a dielectric material.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

The present invention relates to on-wafer electronic device tests and, more specifically, to a test device including cobra probes and methods of using the same. In embodiments, a test device includes cobra probes disposed between metal plates. In accordance with aspects of the invention, cobra probes and/or guide holes in the metal plates of the test device are clad with a dielectric material. Additionally or alternatively, embodiments of the present invention provide a test device having cobra probes flanked by dummy cobra probes (i.e., "dummy probes").

According to various aspects of the invention, the disclosed embodiments add parasitic capacitance to a test apparatus, which reduces the parasitic inductance introduced into a DUT by cobra probes. By doing so, the operational bandwidth of the cobra probes is improved. For example, DUTs that operate at frequencies greater than three gigahertz (3 GHz) can be operationally tested using test devices manufactured according to the aspects of the present invention. More specifically, using metal plates instead of dielectric plates can improve the cobra probe operational bandwidth by 20% or more. Further, using dummy probes can improve the cobra probe operational bandwidth more than 180%. Using metal plates and dummy probes at the same time can improve the cobra probe operational bandwidth by more than 270%.

Figure 1:
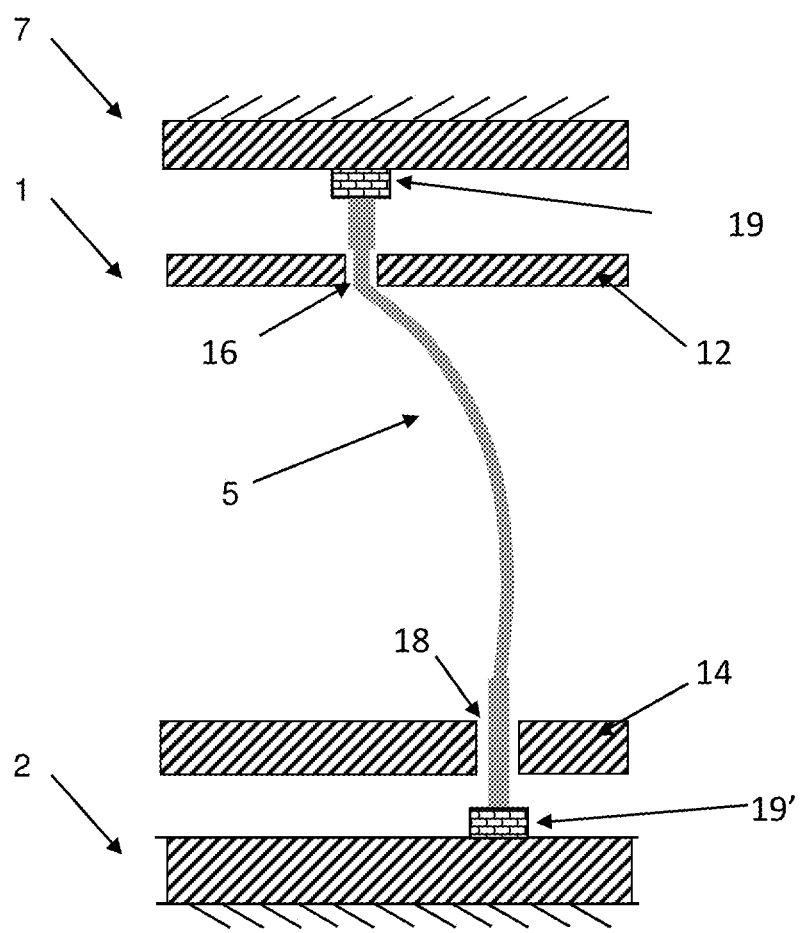
FIG. 1 shows a sectional side view of a test device including a cobra probe.

FIG. 1 shows a sectional side view of an exemplary test device 1. The test device 1 provides an interface with a DUT 2 via a cobra probe 5. The illustrated test device 1 can be part of a cobra probe card that is configured to interface with a test apparatus (e.g., an automatic test equipment, also known as an ATE) through an interface board (i.e., PIB) 7. The test device 1 in FIG. 1 is shown for the sake of illustration. However, the test devices disclosed herein should not be construed to be limited to this example and, instead, test devices having other shapes, sizes, configurations, and components are contemplated by the present invention. For example, one of ordinary skill in the art will understand that the test device in accordance with aspects of the present invention can include various numbers of cobra probes arranged for different areas of the test devices.

As shown in FIG. 1, the test device 1 includes an upper plate 12, a lower plate 14, and cobra probe 5 disposed there between. The upper plate 12 and the lower plate 14 can be comprised of dielectric materials. Exemplary dielectric materials include polytetrafluoroethylene, phenolic cotton paper (i.e., FR-2), cotton paper and epoxy (i.e., FR-3, CEM-1, CEM-2), woven glass and epoxy (i.e., FR-4, FR-5, G-10, CEM-4), matte glass and polyester (i.e., FR-6), non-woven glass and epoxy (i.e., CEM-3), and woven glass and polyester (i.e., CEM-5). Further, in accordance with aspects of the present invention, the upper plate 12 and lower plate 14 can be comprised of conductive materials, such as aluminum, copper, iron, and alloys thereof.

The cobra probe 5 is made of electrically conductive wire that is supported in an upper guide hole 16 extending through the upper plate 12 and a respective lower guide hole 18 extending through the lower plate 14. The upper end of the cobra probe 5 has a tip that fits through the upper guide hole 16 of the upper plate 12 such that upper end will translate in the upper guide hole 16 and electrically connect to the contact pad 19 of the PIB 7. The lower guide hole 18 in the lower plate 14 allow the cobra probe 5 to vertically translate therein to contact the contact pad 19' of the DUT 2 when upward force is applied to their lower ends by the DUT 2. In embodiments, the cobra probe 5 may have a diameter of about 4 mils, a free vertical length of about 220 mils, a compressed vertical length of about 208 mils, and a pitch (i.e., center to center distance between adjacent cobra probes) of about 8 mils. However, the present invention is not limited to a cobra probe having these dimensions; and it should be recognized, however, that cobra probes having other dimensions and shapes are contemplated by the preset invention.

FIGS. 2-8 show cutaway side views of exemplary test devices in accordance with various aspects of the invention. For illustrative purposes, the views of the test devices illustrated in FIGS. 2-8 are simplified to show portions of the test devices, including, but not limited to, an upper plate, a lower plate, a cobra probe, upper guide hole, and lower guide hole. It should be understood that embodiments of the present invention are not limited to the components illustrated in FIGS. 2-8. For instance, embodiments of the test device 1 may include multiple cobra probes that pass through respective upper guide holes and lower guide holes. Further, the test devices may include additional plates and/or layers for mounting, interfacing and manipulating a DUT.

Figure 2:
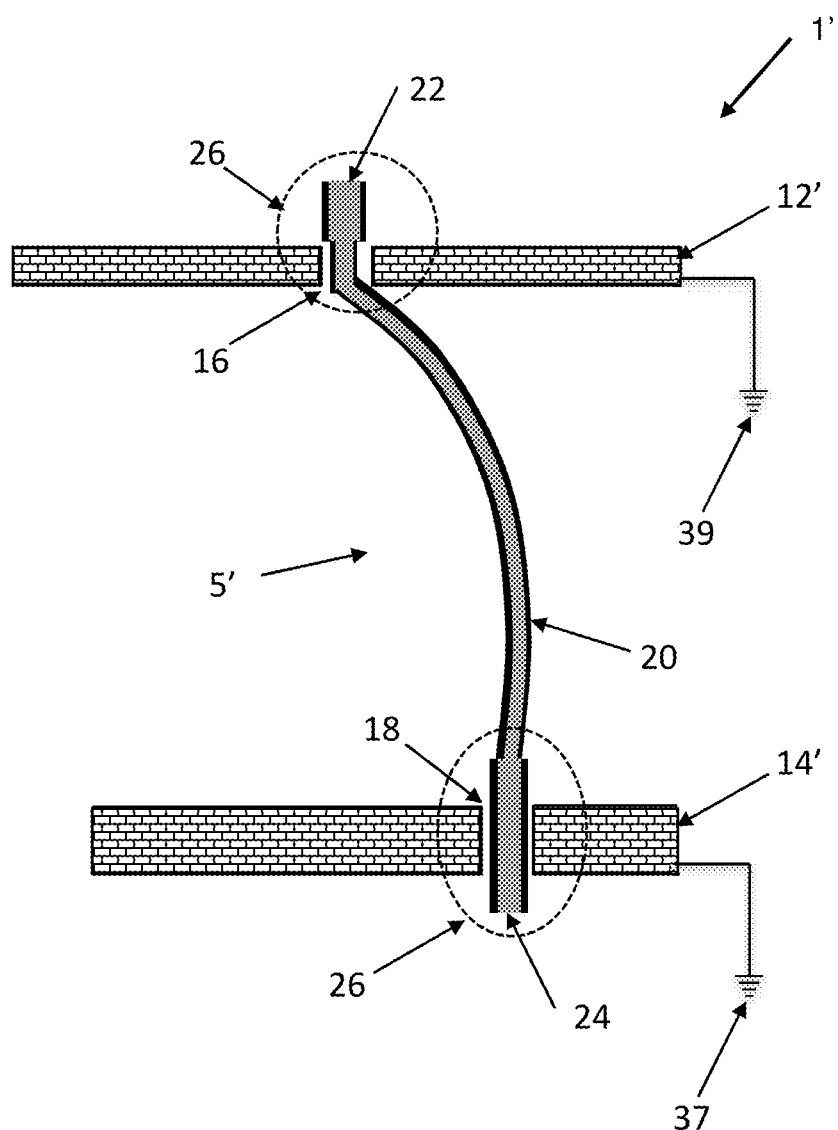
FIG. 2 shows a sectional side view of a test device including a cobra probe in accordance with aspects of the present invention.

FIG. 2 illustrates an exemplary embodiment of the test device 1' in which the upper plate 12' and the lower plate 14' are formed from one or more electrically conductive materials and connected to the electrical grounds 37 and 39, as shown in FIG. 1, which can be grounds of the DUT 2, grounds of the PIB 7, and/or a common system ground. In embodiments, the conductive material includes a metal or a metal alloy including, for example, copper, aluminum, iron, or steel. In the illustrated test device 1', the upper plate 12' is about 8-mil thick and the lower plate 14' is about 25-mil thick, although other thicknesses are also contemplated.

As shown in FIG. 2, the exterior surfaces of the cobra probe 5' are clad with a dielectric material 20, which may be, for example, an oxide ceramic or a polymer (e.g., polytetrafluoroethylene) that electrically insulates the cobra probe 5' from electrically shorting to the metal plates 12' and 14'. The cobra probe 5' may be clad with the dielectric material 20 using conventional techniques, such as coating, spraying, sputtering, brushing, or dipping. In embodiments, the cobra probe 5' is entirely clad in the dielectric material 20 except for a contact tip on an upper end 22 and a contact tip on a lower end 24 where about the cobra probe 5' makes electrical connections with contact pads of a DUT and a PIB, such as the contact pad 19' of the DUT 2 and the contact pad 19 of the PIB 7 shown in FIG. 1. The thickness of the dielectric material 20 can be about 0.2 mils, although other thicknesses are contemplated within the scope of the invention. Alternatively, in accordance with embodiments, the sides of the cobra probe 5' are not entirely clad with the dielectric material 20. Instead, the dielectric material 20 only clads portions 26 of the cobra probe 5' in the areas of the guiding holes 16 and 18, for example, portions of the cobra probe 5' that may come into physical contact with the upper plate 12' or the lower plate 14'.

Using metal plates (i.e., dies) 12' and 14' in the test device 1', rather than dielectric plates (such as shown in FIG. 1), introduces a capacitance between the cobra probe and the plates that significantly decreases the effective inductance of the cobra probes, which can double the operational bandwidth of the test device. For example, the operational bandwidth of the test device may increase from a 0.9 GHz baseline using dielectric plates to about 1.8 GHz using electrically conductive plates 12' and 14'.

Figure 3:
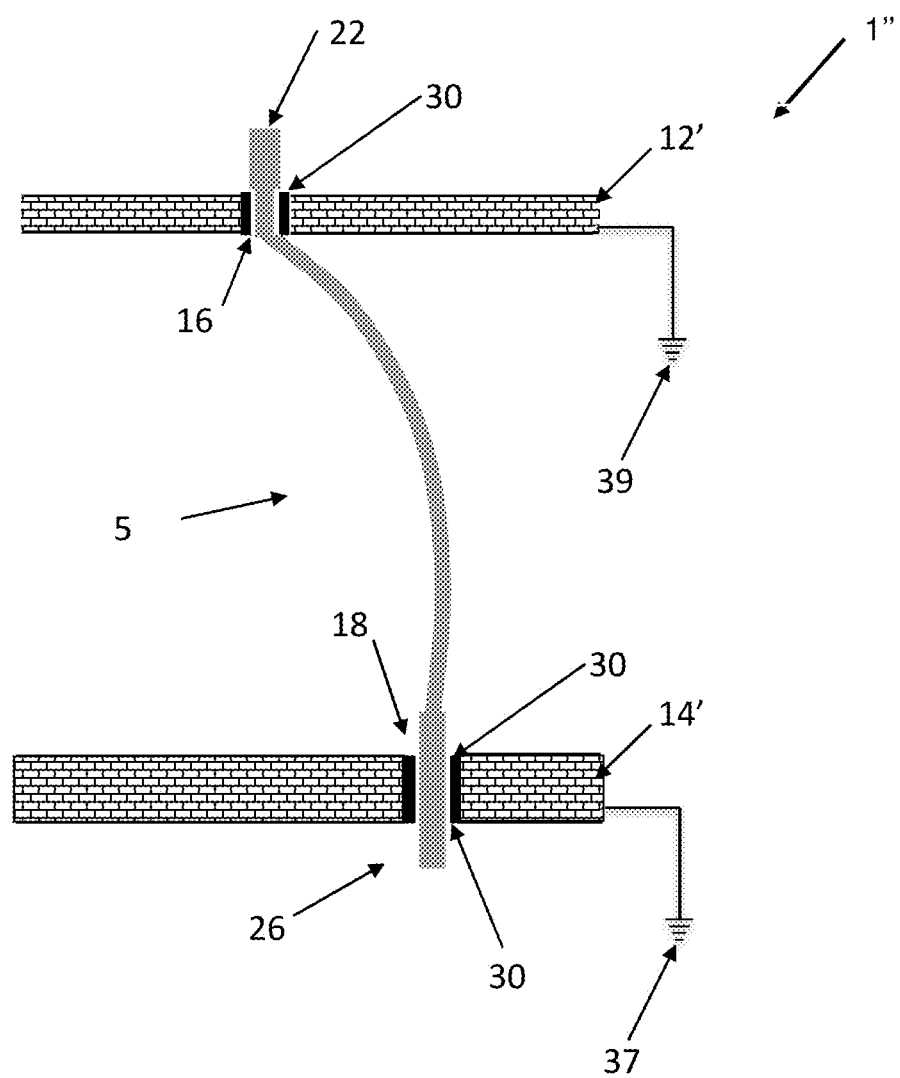
FIG. 3 shows a sectional side view of a test device including a cobra probe in accordance with aspects of the present invention.

FIG. 3 illustrates an exemplary embodiment of the test device 1'' in which the cobra probe 5 is located between the upper plate 12' and the lower plate 14', which are formed from one or more conductive materials and connected to the electrical grounds 37 and/or 39, as described above with respect to FIG. 2. As shown in FIG. 3, the cobra probe is not clad with a dielectric to prevent electrical contact between the cobra probe 5 and the plates 12' and 14'. Instead, in accordance with the aspects of the invention, in portions of the plates 12' and 14', for example, the upper guide holes 16 and the lower guide holes 18, are clad with sleeves of dielectric material 30 (e.g., an oxide ceramic or a polymer, such as polytetrafluoroethylene) that prevents electrical shorting between the metal cobra probe 5 and the conductive plates 12' and 14'. The cladding of dielectric material 30 may be fitted or applied to the guide holes 16 and 18 using conventional techniques, such as adhesive bonding, press fitting, brushing, or spraying. The thickness of the dielectric material 30 may be about 0.2 mils, however other thicknesses are contemplated.

As in the embodiment shown in FIG. 3, using metal plates 12' and 14' in the test device 1'', rather than dielectric plates (such as shown in FIG. 1), introduces a capacitance between the cobra probe and the plates that significantly decreases the effective inductance of the cobra probes. This, in turn, increases the operational bandwidth of test devices, such as test device 1 illustrated in FIG. 1.

Figure 4:
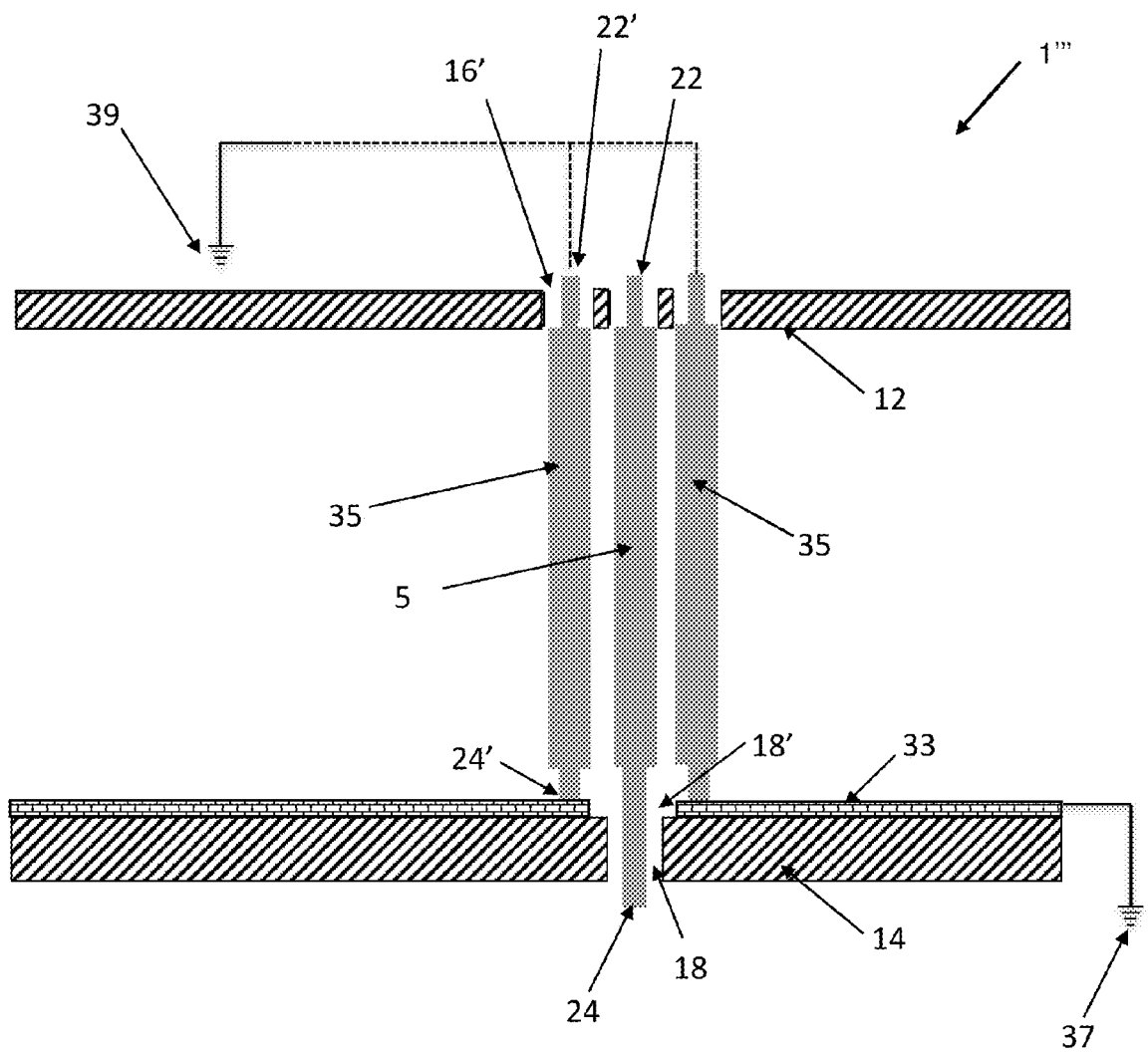
FIG. 4 shows a sectional side view of a test device including a cobra probe and dummy probes in accordance with aspects of the present invention.

FIG. 4 illustrates an exemplary embodiment of the test device 1''' in which the upper plate 12 and the lower plate 14 of the test device 1''' are formed from dielectric materials, such as those described above with respect to FIG. 1. In accordance with aspects of the invention, conductive ground plate 33, which is connected to the ground 37, is attached and/or formed on the lower plate 14, and non-functional, dummy probes 35 flank the functional, cobra probe 5.

The ground plate 33 is comprised of one or more conductive materials (e.g., metals or metal alloys) mounted on the interior surface of the lower plate 14 and electrically connected to the electrical ground 37. In embodiments, the ground plate 33 covers the entire upper surface of the lower plate 14 except a through hole 18' for the functional cobra probe 5 without shorting. Alternatively, in embodiments, the ground plate 33 covers portions of the lower plate 14, such as in areas corresponding to the dummy probes 35.

In accordance with aspects of the present invention, the test device 1''', the dummy probes 35 are mounted in close proximity to the cobra probe 5. The dummy probes 35 are cobra probes mounted in parallel with one or more functional cobra probes such as copra probe 5, for example, in available probe slots adjacent to the functional cobra probe 5. The dummy probes 35, however, do not from an electrical connection between a test apparatus (e.g., contact 19 of the PIB 7 shown in FIG. 1) and a DUT (e.g., contact 19' of the DUT 2 shown in FIG. 1) and, hence, are non-functional. Instead, one or both of the ends of the dummy probe 35 are connected to electrical ground, for example, the grounds 37 and 39. In embodiments, the pitch (i.e., center to center distance) of the dummy probes 35 is between 150 μm and 500 μm from the cobra probe 5. Further, in embodiments the dummy probes 35 are shorter than the cobra probe 5 and do not correspond to any DUT contact pads, such as contact pads 19' shown in FIG. 1. However, as shown in FIG. 4, the ends 22' and 24' of the dummy probes 35 may be connected to electrical grounds 37 and 39, which can be the ground of the PIB 2, as shown in FIG. 1.

In embodiments, lower ends 24' of the dummy probes 35 physically contact the ground plate 33 and connect to the ground 37 without passing through a guide hole (e.g., lower guide hole 18) or the like. The lower ends 24' can be attached to the ground plate 33 using conventional techniques, such as conductive adhesives or soldering. Differently, upper ends 22' of the dummy probes 35 can pass through upper guide holes 16' in the upper plate 12 and connect to the ground 39. Although, in embodiments, the lower ends 24' may be left unconnected to electrical ground (i.e., electrically floating). For instance, the metal layer 33 attached to the bottom plate 14 may be removed, which leaves the lower ends 24' of the dummy probes 35 without ground connections.

Although FIG. 4 shows only two dummy probes 35 flanking a single cobra probe 5, other ratios of dummy probes to cobra probes are contemplated by the present invention. Further, other pitches are contemplated. In embodiments, the pitch of the dummy probes 35 may correspond to the pitch of the cobra probe 5 in the test device 1'''. For example, the center to center distance between the cobra probes 15 and each of the dummy probes 25 may be about 200 microns. An exemplary test device 1''' may include an array of cobra probe 5 disposed at nodes of the array that correspond to contact pads of a DUT, and further include dummy probes 35 at some or all of the nodes of the array that do not correspond to the contact pads of the DUT.

Using dummy probes 35 in the test device 1''' generates a capacitance between the cobra probe 5 and the dummy probes that effectively decreases the inductance of the cobra probes, which can about triple the operational bandwidth of the test device. For example, using dummy probes 35 to flank a functional cobra probe 5 can improve the operational bandwidth of the test device 1''' from 0.9 GHz to about 2.6 GHz, compared to the situation in which dummy probes are not used.

Figure 5:
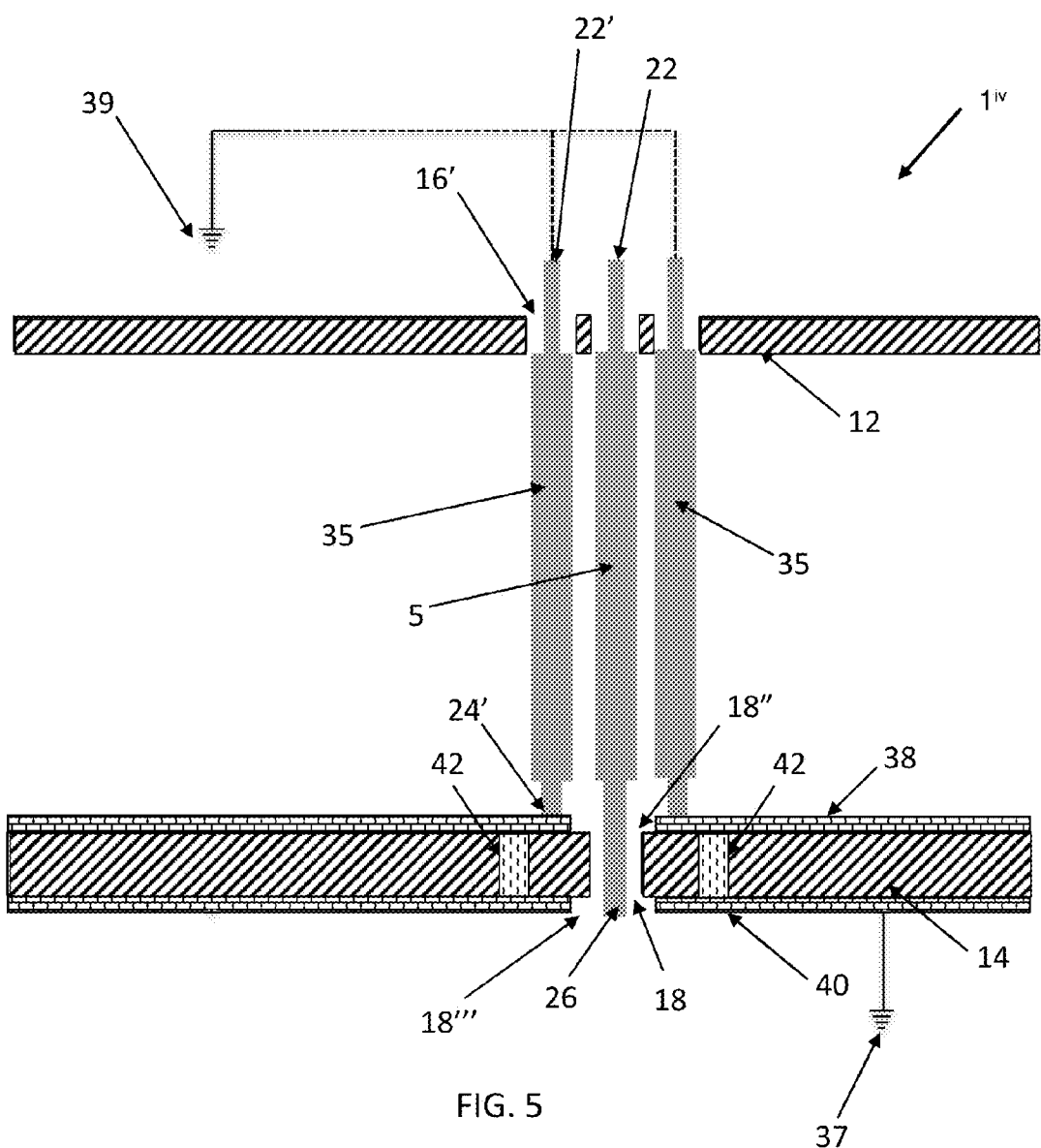
FIG. 5 shows a sectional side view of a test device including a cobra probe and dummy probes in accordance with aspects of the present invention.

FIG. 5 illustrates an exemplary embodiment of the test device 1$^{iv}$, including a functional cobra probe 5 and the dummy probes 35, in which the upper plate 12 and the lower plate 14 are dielectric materials. In accordance with embodiments of the present invention, the lower plate 14 includes a conductive plate 38 that connects to a ground plate 40 by way of one or more vias 42 passing through the lower plate 14. The conductive plate 38 is mounted on the interior surface of the lower plate 14 and is electrically connected to the ground plate 40 below the lower, opposite surface of the lower plate 14 by the electrically conductive vias 42. The conductive plate 38, the ground plate 40 and the vias 42 may be formed from one or more metals or metal alloys. In embodiments, the conductive plate 38 covers the entire upper surface of the lower plate 14 except through hole 18'' for the functional cobra probe 5, as shown in FIG. 5. Alternatively, in embodiments, the conductive plate 38 covers portions of the lower plate 14 in areas corresponding to the dummy probes 35. In such case, each portion of the conductive plate 38 may connect to the ground plate 40 through one or more respective vias 42. Additionally, in embodiments the ground plate 40 covers the entire lower surface of the lower plate 14, except for a through hole 18''' for the functional cobra probe 5. Alternatively, in embodiments, the ground plate 40 covers portions of the lower plate 14 in areas corresponding to the dummy probes 35, and each portion may have one or more vias 42 connecting to the conductive plate 38.

Still referring to FIG. 5, the lower ends 24' of the dummy probes 35 directly contact the conductive plate 38, which connects to the ground 37 through the ground plate 40 and the vias 42. That is, the dummy probes 35 connect to the ground 37 without passing through any guide hole (e.g., lower guide hole 18) or the like. The lower ends 24' may be attached to the conductive plate 38 using conventional techniques, such as conductive adhesives or soldering. The upper ends 22' of the dummy probes 35 can pass through upper guide holes 16' in the upper plate 12 and connect to the ground 39, for example, through the ground pads of a PIB, such as PIB 7 shown in FIG. 1.

As discussed above with respect to FIG. 4, using dummy probes 35 in the test device 1$^{iv}$ generates a capacitance between the cobra probe 5 and the dummy probes 35. Doing so effectively decreases the effective inductance of the cobra probes and increase the operational bandwidth of the test device by about three-fold.

Figure 6:
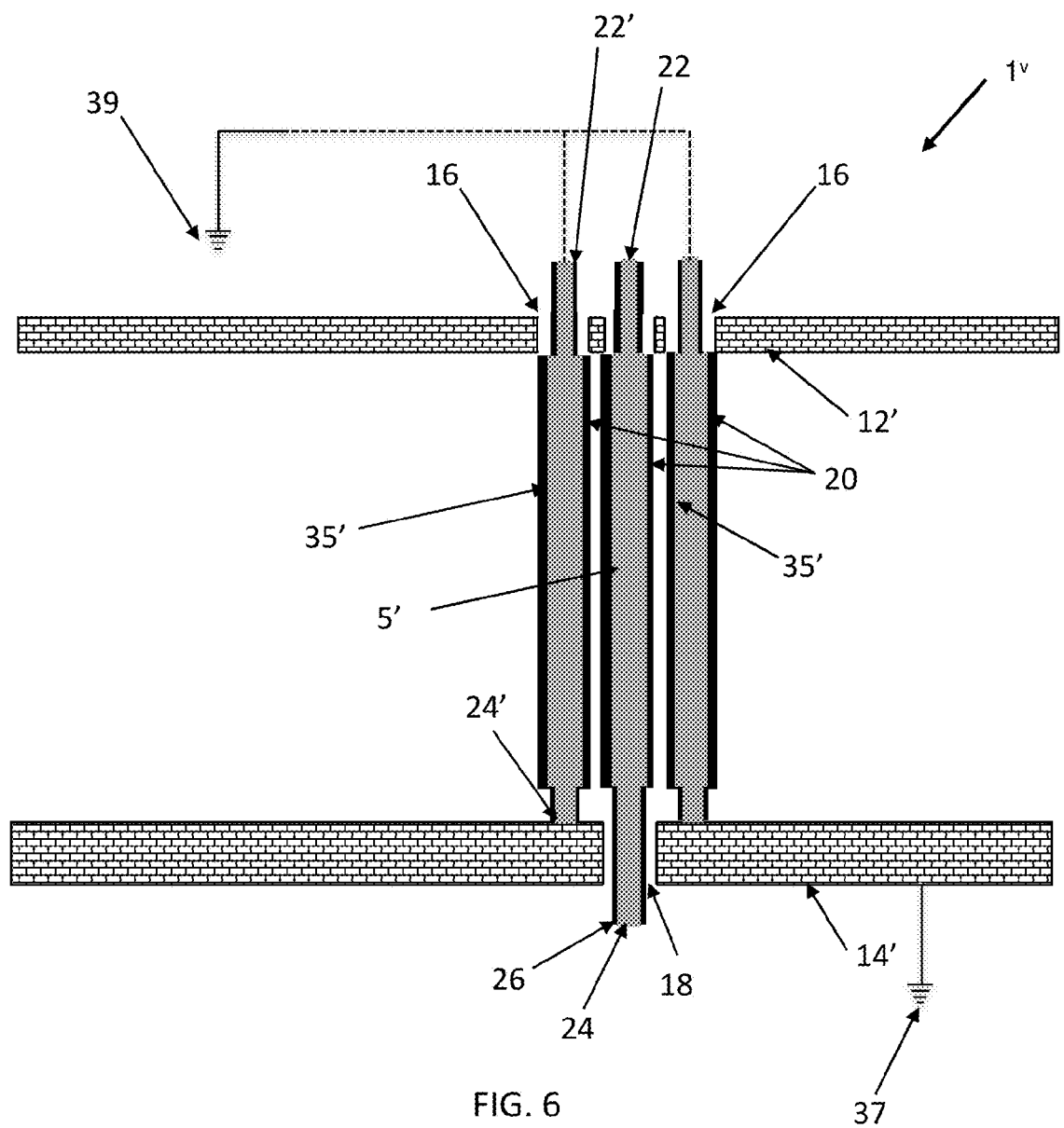
FIG. 6 shows a sectional side view of a test device including a cobra probe and dummy probes in accordance with aspects of the present invention.

FIG. 6 illustrates an exemplary embodiment of the test device 1$^{v}$, including a functional cobra probe 5' and dummy probes 35', in which the upper plate 12' and the lower plate 14' are formed of a conductive material, for example, in a manner similar to the described with respect to FIG. 2. In embodiments, the lower ends 24' of the dummy probes 35' physically contact the lower plate 14', which can be connected to the ground 37 (e.g., ground of the PIB 7 shown in FIG. 1). The upper ends 22' of the dummy probes 35' pass through upper guide holes 16' in the upper plate 12', which can be connected to the ground 39 (e.g., a ground of the PIB 7 shown in FIG. 1).

Further, in accordance with aspects of the invention, the exterior surfaces of the cobra probe 5' and the exterior surfaces of the dummy probes 35' (optional) are clad with a dielectric material 20 similar to that described above with respect to FIG. 2, which electrically insulates the probe 5' from electrically shorting to the plates 12' and 14'. In embodiments, the cobra probe 5' and the dummy probes 35' are entirely clad in the dielectric material 20 (e.g., an oxide ceramic or polymer) but for the contact tips on the ends 22, 22', 24, and 24' of the probe 5' and 35'. The thickness of the dielectric material 20 can be about 0.2 mils, although other thicknesses are contemplated within the scope of the invention. In addition, it is contemplated that, in some embodiments, the dummy probes 35' are not clad with the dielectric material 20 since they are connected to ground 37 and/or ground 39. As discussed previously, the dummy probes 35' provide a capacitance with the cobra probe 5' that increases the operational bandwidth of the test device $1^v$ by decreasing the effective inductance of the cobra probe.

Figure 7:
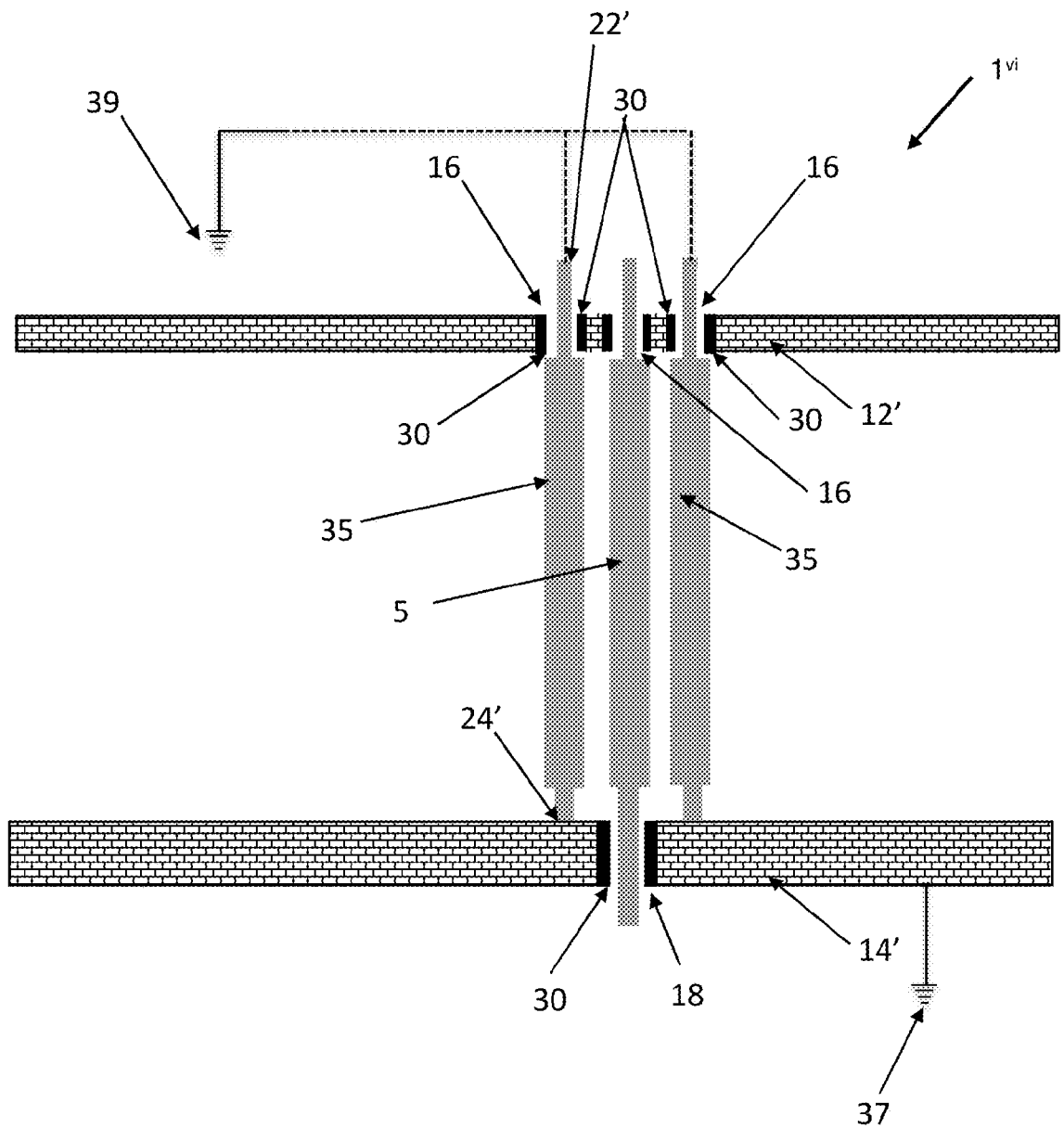
FIG. 7 shows a sectional side view of a test device including a cobra probe and dummy probes in accordance with aspects of the present invention.

FIG. 7 illustrates an exemplary embodiment of the test device $1^{vi}$, including a functional cobra probe 5 and dummy probes 35, in which the upper plate 12' and the lower plate 14' are formed of a conductive material, such as a metal, for example, as described above with respect to FIG. 3. According to aspects of the invention, the cobra probe 5 is flanked by dummy probes 35. As described above with respect to FIG. 6, the lower plate 14' can be connected to the ground 37 (e.g., a ground of the PIB 7 shown in FIG. 1). The upper contacts 22' of the dummy probes 35 can pass through guide holes 16 in the upper plate 12' and connect to the ground 39 (e.g., a ground of the PIB 7 shown in FIG. 1). Further, the lower contacts 24' of the dummy probes 35 are connected to the ground 37 via a direct connection to the lower plate 14'.

Similar to the system illustrated in FIG. 3, in accordance with aspects of the present invention, the upper guide holes 16 and the lower guide hole 18 are clad with a sleeve of dielectric material 30 that insulates the probe 5 from the metal plates 12' and 14'. The cladding of dielectric material 30 may be fitted or applied to the guide holes 16 and 18 using conventional techniques, such as adhesive bonding, press fitting, brushing, or spraying. The thickness of the dielectric material 30 may be about 0.2 mils, however other thicknesses are contemplated. The conductive plates and the dummy probes both provide a capacitance with the cobra probe 5 that increases the operational bandwidth of the test device by decreasing the effective inductance of the cobra probes.

Figure 8:
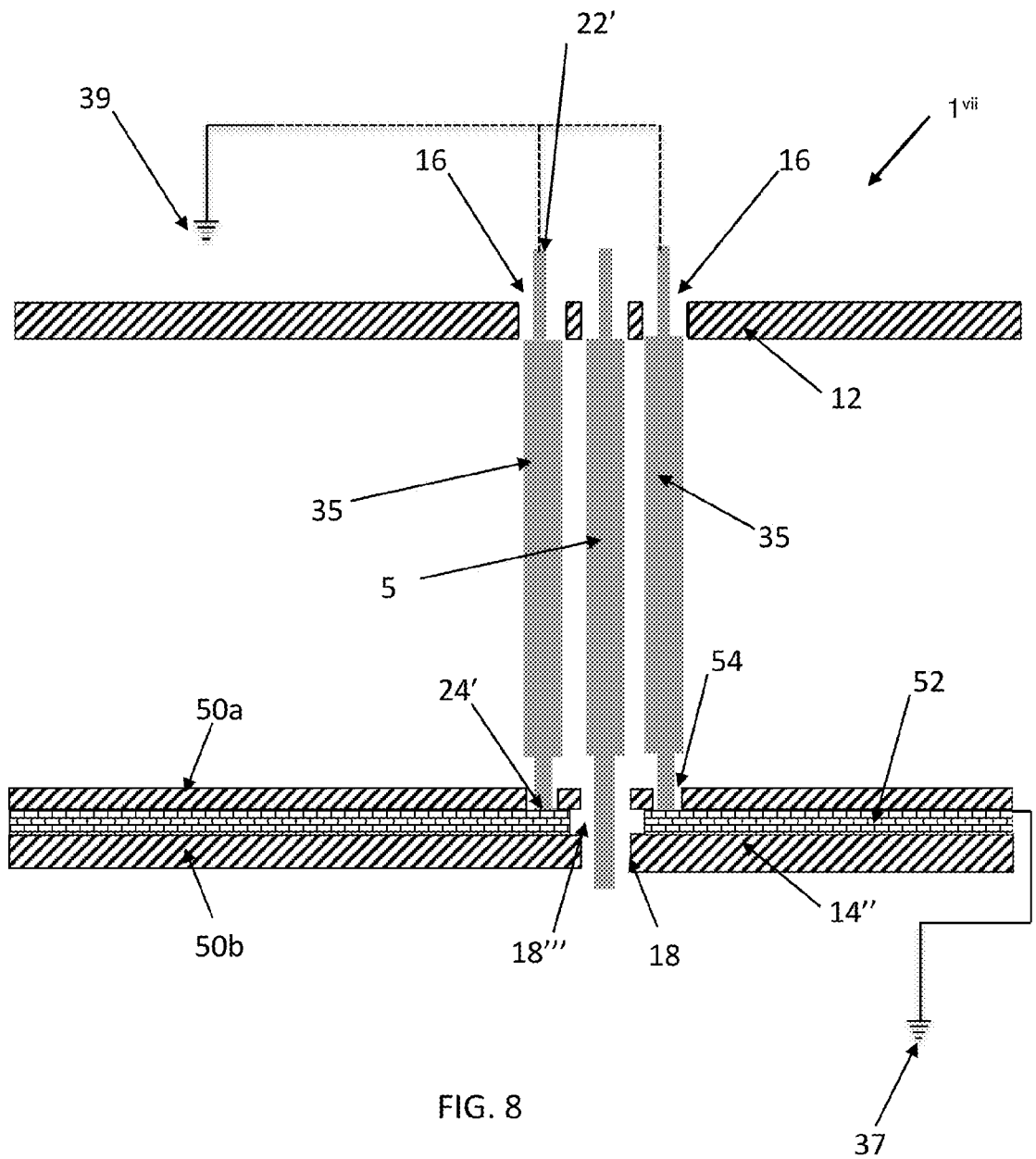
FIG. 8 shows a sectional side view of a test device including a cobra probe and dummy probes in accordance with aspects of the present invention.

FIG. 8 illustrates an exemplary embodiment of the test device $1^{vii}$ in which the upper plate 12 and the lower plate 14" are formed from a dielectric material. In accordance with aspects of the invention, the lower plate 14" includes an embedded plate 52 sandwiched between an upper dielectric layer 50a and a dielectric lower dielectric layer 50b of the lower plate 14". The embedded plate 52 is a conductive material, such as a metal or metal alloy. Further, in embodiments, the embedded plate 52 is connected to the ground 37.

As shown in FIG. 8, the lower contacts 24' of the dummy probes 35 physically contact the embedded plate 52. In embodiments, the lower contacts 24' are attached to the embedded plate 52 via holes 54 formed in the upper dielectric layer 50a of the lower plate 14". The lower contacts 24' can be affixed to the embedded plate 52 using conventional methods, such as soldering or conducive adhesives. Further, the holes 54 can be sized corresponding to the diameter of the dummy probes 35 such that the probes can be press-fit into the holes 54. Further, as discussed previously, the upper contacts 22' of the dummy probes 35 can pass through the guide holes 16 in the upper plate 12 and connect to the ground 39. As discussed previously, the dummy probes 35' provide a capacitance with the cobra probe 5' that increases the operational bandwidth of the test device $1^{vi}$ by decreasing the effective inductance of the cobra probes. In order to prevent a short between the functional cobra probe 5 and the embedded metal plate 52, the size of the through hole 18''' of the metal plate 52 for the cobra probe 5 is larger than the size of the through hole 18 of the lower plate 14" by 1 mil, however other numbers are contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed:

1. A test device, comprising
a conductive upper plate having an upper guide hole;
a conductive lower plate having a lower guide hole;
a conductive cobra probe disposed between the upper guide hole of the upper plate and the lower guide hole of the lower plate;
one or more dummy probes flanking the cobra probe; and
a dielectric material insulating the cobra probe from the upper plate and the lower plate,
wherein:
a lower end of the one or more dummy probes is contacting an interior surface of the lower plate;
the lower plate is connected to an electrical ground; and
an upper end of the one or more dummy probes is electrically grounded.

2. The test device of claim 1, wherein the dielectric material clads surfaces of the cobra probe.

3. The test device if claim 1, wherein the dielectric material clads surfaces of the upper guide hole and the lower guide hole.

4. The test device of claim 1, wherein the dielectric material clads the one or more dummy probes.

5. A test device comprising
an upper plate having an upper guide hole;
a lower plate having a lower guide hole;
a conductive cobra probe disposed between the upper guide hole of the upper plate and the lower guide hole of the lower plate; and
one or more dummy probes disposed between the upper plate and the lower plate flanking the cobra probe,
wherein:
the upper plate and the lower plate are comprised of a dielectric material;
a lower end of the one or more dummy probes contact a conductive plate mounted on the lower plate; and
the conductive plate is on an interior of the lower plate and is connected to a ground plane disposed on an opposite surface of the lower plate by at least one conductive via through the lower plate.

6. The test device of claim 5, wherein an upper end of the one or more dummy probes is electrically grounded.

7. The test device of claim 5, wherein a dielectric material clads the cobra probe and the one or more dummy probes.

8. The test device of claim 5, wherein a dielectric material clads the upper guide holes and the lower guide holes.

9. The test device of claim 5, wherein:
the lower plate comprises an upper dielectric layer, a lower dielectric layer, and a conductive layer sandwiched between the upper dielectric layer and the lower dielectric layer;
the conductive layer is electrically grounded; and
the lower ends of the one or more dummy probes contact the conductive layer via holes in the upper dielectric layer of the lower plate.

10. A method of forming a test device, comprising:
arranging a conductive cobra probe between an upper guide hole of an upper plate and a lower guide hole of a lower plate connected to an electrical ground;
insulating the cobra probe from the upper plate and the lower plate using a dielectric material; and
providing one or more dummy probes flanking the cobra probe, wherein the one or more dummy probes are provided such that a lower end of the one or more dummy probes is contacting an interior surface of the lower plate, and an upper end of the one or more dummy probes is electrically grounded.

11. The method of claim 10, further comprising forming the upper plate and the lower plate from an electrically conductive material.

12. The method of claim 11, wherein the insulating the cobra probe comprises cladding the cobra probe with a dielectric material.

13. The method of claim 11, wherein the insulating the cobra probe comprises cladding the upper guide hole and the lower guide hole with a dielectric material.

* * * * *